(12) United States Patent
Popp et al.

(10) Patent No.: US 10,754,014 B2
(45) Date of Patent: Aug. 25, 2020

(54) RECEIVER DEVICE, SENSOR DEVICE AND METHOD FOR DETERMINING DISTANCES

(71) Applicants: ESPROS Photonics AG, Sargans (CH); Valeo Schalter und Sensoren GmbH, Bietigheim-Bissingen (DE)

(72) Inventors: Martin Popp, Chur (CH); Beat De Coi, Maienfeld (CH); Jan Simon, Bietigheim-Bissingen (DE); Peter Horvath, Bietigheim-Bissingen (DE); Lin Lin, Bietigheim-Bissingen (DE); Thomas Schuler, Bietigheim-Bissingen (DE); Felix Mueller, Bietigheim-Bissingen (DE); Heiko Hofmann, Bietigheim-Bissingen (DE)

(73) Assignees: Espros Photonics AG, Sargans (CH); Valeo Schalter Und Sensoren GmbH, Bietigheim-Bissingen (DE)

( * ) Notice: Subject to any disclaimer, the term of this patent is extended or adjusted under 35 U.S.C. 154(b) by 281 days.

(21) Appl. No.: 15/799,000

(22) Filed: Oct. 31, 2017

(65) Prior Publication Data

US 2018/0128907 A1    May 10, 2018

(30) Foreign Application Priority Data

Nov. 4, 2016  (EP) ..................................... 16197243

(51) Int. Cl.
 *G01S 7/486*   (2020.01)
 *G01S 17/10*   (2020.01)
 (Continued)

(52) U.S. Cl.
 CPC .......... *G01S 7/4861* (2013.01); *G01S 7/4863* (2013.01); *G01S 7/4865* (2013.01); *G01S 17/10* (2013.01);
 (Continued)

(58) Field of Classification Search
 CPC .... G01S 7/4861; G01S 7/4865; G01S 7/4863; G01S 17/89; G01S 17/10;
 (Continued)

(56) References Cited

U.S. PATENT DOCUMENTS 5,388,137 A * 2/1995 Bosiers ............. H01L 27/14831
 257/221
9,377,405 B2 * 6/2016 Mohler ................. G01J 3/2889
(Continued)

FOREIGN PATENT DOCUMENTS

WO    2010/025331 A1    3/2010
WO    2016/128198 A1    8/2016

OTHER PUBLICATIONS

Extended European Search Report (Application No. 16197243.5) dated May 9, 2017.

*Primary Examiner* — Daniel L Murphy
(74) *Attorney, Agent, or Firm* — Burr & Brown, PLLC

(57) ABSTRACT

In order to measure distances precisely, a receiver device for determining a distance from an object is proposed, comprising: a receiver having a semiconductor structure with a photosensitive region for generating photo-induced charge carriers, which region faces the rear side, and having a transportation region, which faces the front side, wherein the photosensitive region and the transportation region are spatially separated from one another by a separation layer which has a passage between the photosensitive region and the transportation region, wherein the transportation region has an arrangement of at least two gates lying one next to the other, at least one of the gates thereof being located in the overlapping region of the passage.

14 Claims, 2 Drawing Sheets

(51) Int. Cl.
  *H01L 27/148* (2006.01)
  *G01S 7/4861* (2020.01)
  *G01S 7/4865* (2020.01)
  *G01S 7/4863* (2020.01)
  *H01L 27/146* (2006.01)
  *G01S 17/89* (2020.01)

(52) U.S. Cl.
  CPC .......... *G01S 17/89* (2013.01); *H01L 27/1463* (2013.01); *H01L 27/1464* (2013.01); *H01L 27/14609* (2013.01); *H01L 27/14638* (2013.01); *H01L 27/14856* (2013.01)

(58) Field of Classification Search
  CPC ........... H01L 27/14638; H01L 27/1464; H01L 27/1463; H01L 27/14609; H01L 27/14856
  USPC ...................................................... 356/5.01
  See application file for complete search history.

(56) References Cited

U.S. PATENT DOCUMENTS

2014/0145281 A1   5/2014   Bever et al.
2017/0293031 A1   10/2017  Popp

* cited by examiner

RECEIVER DEVICE, SENSOR DEVICE AND METHOD FOR DETERMINING DISTANCES

This application claims the benefit under 35 USC § 119(a)-(d) of European Application No. 16 197 243 filed Nov. 4, 2016, the entirety of which is incorporated herein by reference.

FIELD OF THE INVENTION

The present invention relates to a receiver device for determining a distance from an object, a sensor device, and a method for determining a distance from an object.

BACKGROUND OF THE INVENTION

Numerous distance sensors are known from the prior art, in particular TOF ("time of flight") sensors in which, for example, the distance is determined by measuring a propagation time of a light signal. WO 2016/128198 discloses, for example, a TOF distance sensor in which by using a modulation frequency the quantity of detected charge carriers is divided into corresponding time intervals and respectively compiled. Corresponding demodulation pixels are used for this purpose. By means of a correlation, it is possible to correspondingly receive the phase information from which the difference in propagation time or the distance is obtained.

SUMMARY OF THE INVENTION

The object of the present invention is to permit distances to be determined as precisely as possible.

The receiver device according to the present invention serves to determine a distance from an object. The receiver device can be used, for example, as a component of an optical sensor device, as e.g. in the context of monitoring devices for doors or gates for garages, lifts, for sensors in the field of automobiles, for systems for monitoring car parks or the like. The receiver device according to the present invention, therefore, initially comprises a receiver for receiving reflected signals which are reflected at the object from which the distance is to be determined. When the signals are received, photo-induced charge carriers are generated.

Accordingly, the receiver device according to the present invention is distinguished by the following features or following design: the receiver comprises a semiconductor structure for detecting photons. These photons which are received originate from the signals reflected at the object.

In this context, the semiconductor structure is in turn designed to be back lit. Backlighting generally has the advantage that a relatively large lighting area can be used for detection. If the radiation to be detected impinges e.g. from the front side on the semiconductor structure on which further semiconductor components or electronic components are mounted, there is generally a smaller detection area available. In the case of lighting on the front side, at least part of the area is covered by these further electronic components which serve, for example, to evaluate and further process the signals. Furthermore, backlighting provides the advantage that a relatively large region can also be made available in the semiconductor substrate, which region is embodied as a photosensitive region for generating photo-induced charge carriers. This photosensitive region correspondingly faces the rear side.

However, in addition to the photosensitive region, the semiconductor structure also comprises a transportation region for transporting charge carriers. Initially the generated charge carriers can be transported away or onward from the photosensitive region via this transportation region. In particular, the transportation region can also make it possible for a chronological sequence to be converted into a spatial sequence, which can be used, in particular, to carry out precise measurement of time and therefore also improve the determination of distance. The photosensitive region and the transportation region are separated from one another by a separation layer, but with the exception of a passage between the photosensitive region and the transportation region, which passage permits charge carriers to pass from the photosensitive region into the transportation region.

In one embodiment of the present invention, the separation layer can be embodied as a buried layer. A buried layer can be generated using bulk material, for example, by means of ion implantation. The screening or separating effect of the separation layer can be achieved by means of doping. However, the separation layer can basically also be embodied as a non-conductor layer. The separation layer can also be applied to the bulk, wherein the region located above the separation layer is formed by growing further layers, with the result that a type of sandwich design is produced.

The passage, in particular, permits the charge carriers to pass into the surroundings of the transportation region at a defined location. Therefore, separate quantities of charge carriers can be transported onward from the region of the passage via the transportation region at time intervals. This, therefore, results in a fixed assignment of a location to a quantity of charge carriers which have been generated in the semiconductor substrate at a specific time or in a specific time interval. In order to transport the charge carriers, the transportation region has an arrangement of at least two gates lying one next to the other, at least one of the gates thereof being located in the overlapping region of the passage. These gates in the overlapping region of the passage can therefore act directly on charge carriers in the photosensitive region, e.g. attract them, through the passage.

The charge carriers which have been generated in the photosensitive region of the semiconductor structure can be influenced by the potential of a gate. Accordingly, in one embodiment of the present invention, a voltage can be applied to each of the gates in order to move charge carriers under the respective gate in the transportation region. Gates which are arranged in the overlapping region of the passage can, therefore, move the charge carriers out of the photosensitive region and transport them into their surroundings, that is to say into the transportation region.

Further gates which are arranged next to the gates located in the overlapping region of the passage can ensure that the quantities of charge carriers are transported onward. Through this "sucking away" of the charge carriers from the photosensitive region into the transportation region and the onward transportation within the transportation region, the charge carriers are removed from the photosensitive region and transported onward, depending on when or in which time interval they were generated. A spatial sequence or a spatial representation of the signal is, therefore, obtained from this chronological sequence using the receiver device. The assignment of the predefined chronological sequence to corresponding spatial coordinates results from the geometry of the transportation region or the spatial arrangement of the gates within the transportation region. If the gates are arranged one next to the other, the chronological coordinate is respectively assigned to a spatial coordinate along the path arrangement of the gates.

In order to simplify this chronological-spatial assignment and to permit it to occur regularly or continuously, in one embodiment variant of the invention a clock generator is provided in order to alternately apply a voltage in succession to the gates. The charge carriers are therefore moved under the respective gate or transported along the transportation region. As a result, continuous detection is made possible and distinct chronological coordinates are assigned to each point on the transportation path by the clock specification. As a result of the selection of the clock, it is, in particular, also possible to determine the chronological resolution. Generally, it is necessary to ensure that the clock frequency is adapted to the charge carrier transportation from gate to gate so that as few charge carriers as possible are lost during the transportation.

In one embodiment of the present invention, the photosensitive region and the passage have a first doping, while the separation layer has a second doping, and the transportation region has a third doping. The second doping, which is therefore to be assigned to the separation layer, is of the opposite sign to the first or third doping, and the charge carriers can therefore be screened as a result.

As already illustrated, in one embodiment of the present invention, the at least one gate which is arranged in the overlapping region of the passage is designed to move the charge carriers from the photosensitive region into the transportation region through the passage by virtue of the fact that a corresponding voltage can be applied to the gate. It is also conceivable that the passage region is covered by two or more gates. It is necessary for the charge carriers to be transported away from the photosensitive region in order to in turn clear the photosensitive region for further charge carriers which are generated later. In addition, during the onward transportation of the charge carriers which have already been moved from the photosensitive region these corresponding quantities of charge carriers should be able to be transported onward on the transportation path, with the result that a spatial coordinate corresponding to the time or time period of the detection is assigned to the quantities.

In a corresponding embodiment of the present invention, the clock generator therefore serves to convert a chronological resolution into a spatial resolution, wherein the clock generator is designed to move the charge carriers from the photosensitive region at chronologically predefined intervals into the transportation region and to transport them on from there along the transportation region. By means of the clock rate, it is also possible to adjust how precisely the received signal is to be sampled in its chronological profile.

In one advantageous development of the present invention, the transportation region can be embodied as a conveyor belt structure of a CCD ("charge-coupled device"). In a conveyor belt structure, a plurality of electrodes or gates are arranged one next to the other and a potential is alternately applied thereto with the result that the charge carriers located in the regions are attracted or repelled. Therefore, quantities or packets of charge carriers can be moved from gate to gate. In the case of a CCD, also, a potential is correspondingly alternately applied to the gates, which potential can attract, for example, the corresponding charge carriers which are located in the surroundings. For the purpose of transportation, e.g. a specific quantity of charge carriers is located under a gate to which a potential is applied. Subsequently, the same potential is applied to the gate located next to said gate. A portion of the charge carriers therefore move under the second, adjacent gate. The potential of the first gate is then changed, and the entire quantity of charge carriers is therefore attracted by the second gate and collects underneath it. The transportation of the charge carriers can be implemented in this way.

In one exemplary embodiment of the present invention, the gates can be embodied as metal contacts which are arranged on the front side of the semiconductor substrate, that is to say on the side facing the transportation region. The metal contacts permit the charge carriers to be subjected to a comparatively high potential. As a result, the transportation can be improved and the loss of charge carriers during transportation can be reduced.

In order to promote the generation of photo-induced charge carriers, in one exemplary embodiment, the photosensitive region and the passage (first doping) are comparatively weakly doped. So that the separation layer (second doping) forms good separation or insulation, it is advantageously doped to a significantly greater degree.

In order to permit rapid transportation of the charge carriers, the third doping in the transportation region can also be embodied comparatively strongly.

In order finally to be able to read out the detected signal in the chronological sequence thereof, the transportation region comprises a reading device for determining the quantity of the charge carriers. This reading out process takes place, in particular, in the sequence in which the quantities of charge carriers travel to the reading device via the transportation path or via the gates. During the determination of the quantities of the charge carriers it is generally only necessary to be able to detect relative differences between the determined quantities in the time profile or spatial profile. In contrast, it is generally not necessary to determine individual absolute values. In this manner, in which only relative size comparisons of the quantities of charge carriers are examined, it is at least possible to determine the profile of the signal to the extent that an extreme value of the signal can be detected very precisely. This applies all the more if the principal profile of the detected signal is known. If the signal is, for example, a Gaussian pulse, it is expected that the pulse has a regular and previously known shape with an extreme value, namely a maximum value. The shape in the chronological sequence of the signal can therefore be reconstructed by means of a weighted formation of mean values or by determining the positive gradients or edges of the signal, wherein, in particular, the position of the maximum value (in the chronological sequence) can be determined very precisely.

As a result, precise distance measurement is, therefore, also made possible, since accordingly it can also be determined precisely what propagation time the signal has used.

In one embodiment variant of the present invention, it is, therefore, possible to provide e.g. a time measuring device for determining the time period between the emission of the light pulse and the reception of the reflected light pulse. Depending on the type of sensor device it is possible to work explicitly with a propagation time, with a phase shift or the like. In particular, in one embodiment of the present invention, it is possible to provide an evaluation apparatus which is designed to determine the maximum value in the chronological intensity profile of the light signal or of the light pulse. For this purpose, a mean value (arithmetic, geometric) can be determined.

The signal which arrives at the receiver device or the receiver and is detected in the semiconductor substrate or in the photosensitive region thereof has a time profile. In the corresponding time intervals, parts of the signal are therefore transported away in the form of quantities of charge carriers from the photosensitive region and moved over a transportation path of a transportation region. In the next time interval of the detection, a new part of the received light signal is converted into charge carriers, and these are likewise moved onto the transportation path of the transportation region, but with a chronological offset with respect to the previously transported charge quantity and therefore with a different spatial coordinate at the same point in time. Since these corresponding sampled signal parts each pass through the predefined spatial points on the transportation path in succession in the chronological profile, there is a distinct assignment between the time of detection or of occurrence of the signal and the spatial coordinate within the transportation path on the transportation region. In particular, if the signal has an already predefined shape, advantageously a simple shape with a single extreme value, for example a Gaussian pulse, the spatial focal point of the charge distribution can be determined by forming mean values or by detecting the edge by means of the gradients. The formation of mean values or the edge detection make it possible to determine the focal point of the detected signal more precisely than the resolution which is predefined by the gate structure, or more accurately in terms of timing than the predefined clocking. As a result, the desired distance can therefore advantageously be measured very precisely.

Furthermore, the present invention also permits a signal which varies quickly in its time profile to be "equalized" and therefore to be able to be processed better because the signal is sampled only with a comparatively low resolution but the information relating to the spatial or chronological focal point is retained.

In one development of the present invention, the receiver can be embodied, in particular, as a matrix, i.e. the distance measurement is not the only spatial information which can be acquired but instead a two-dimensional structure can also be correspondingly sampled by the matrix. In particular, 3D sensors can therefore advantageously be manufactured. In particular in the depth resolution such 3D sensors have a particularly high level of efficiency.

Accordingly, a sensor device according to the present invention for determining a distance from an object is distinguished in that a transmitter for emitting light pulses and a receiver device according to the present invention or a receiver device according to one exemplary embodiment of the present invention is used. The sensor device can be embodied, in particular, as a TOF sensor device. The advantages, already mentioned above, of the present invention or of the corresponding exemplary embodiments of the present invention can, therefore, be utilized for such a sensor device.

In addition, a method according to the present invention for determining a distance from an object, in which the propagation time of a pulse is measured, is distinguished by the following method steps. Firstly, a light pulse is emitted, in particular, with a maximum value in the chronological intensity profile. The light pulse is reflected at an object, and the reflected signal is received, wherein for this purpose a photosensitive region of a semiconductor substrate of a semiconductor structure is used to generate photo-induced charge carriers. A transportation region, which is separated off from the photosensitive region by a separation layer but has a passage, with the result that the charge carriers can be transported through the passage but not through the separation layer, is provided in the semiconductor structure.

In one exemplary embodiment, the passage can have doping of the same sign in comparison with the photosensitive region or the transportation region.

In the region of the transportation path in the transportation region, at least two gates lying one next to the other are provided, wherein the gates which are arranged in the overlapping region of the passage can ensure that charge carriers from the photosensitive region pass into the transportation region. The passing on of the charge carriers via the transportation path takes place in a clocked fashion. Overall, in order to carry out this method, receiver devices or sensor devices according to the present invention or according to an exemplary embodiment of the present invention can be used. The chronological sequence of the detected signal is therefore converted into a spatial sequence. The sequence of the rasterized pulse can be measured by passing on via the transportation path. The spatial focal point of the charge distribution and therefore the chronological focal point of the signal can be determined in turn by forming mean values or by edge detection. This determination can be more precise than the chronological rasterization which is predefined by the clocking. The time which is available for evaluating the signal may be longer than the variation over time of the signal itself. Therefore, the detection can also take place in a comparatively cost-effective way.

BRIEF DESCRIPTION OF THE DRAWINGS

An exemplary embodiment of the present invention is illustrated in the drawings and will be explained in more detail below with specification of further details and advantages.

DETAILED DESCRIPTION OF THE INVENTION

Figure 1:
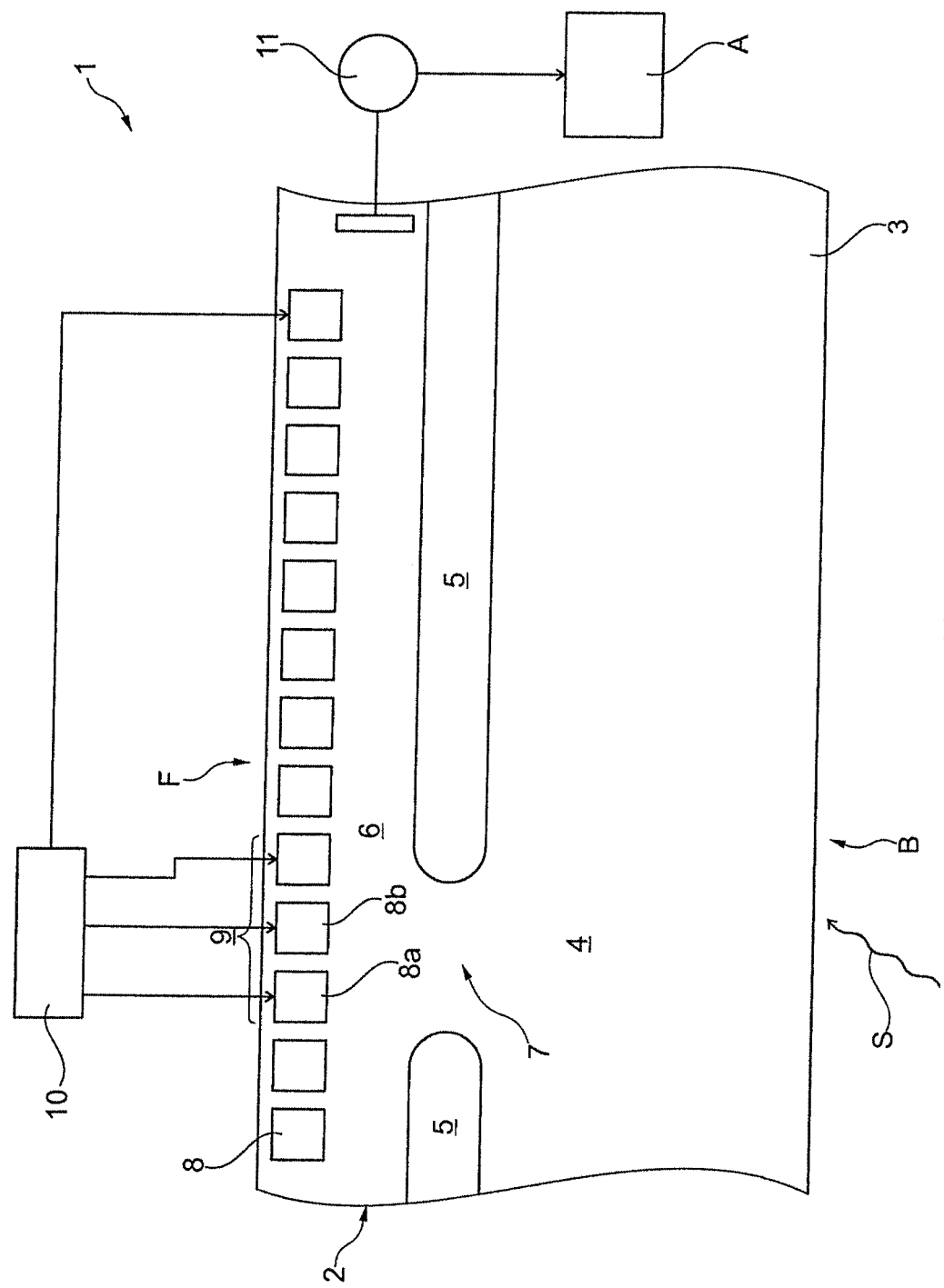
FIG. 1 shows a schematic illustration of a receiver device according to the present invention.

FIG. 1 shows a schematic illustration of a receiver device 1 according to the present invention. The receiver device or the receiver comprises a semiconductor structure 2 with a semiconductor substrate 3. The semiconductor structure 2 in turn has a front side F and a rear side B, wherein the light signals S to be detected impinge on the rear side B. In the region of the rear side B, there is a photosensitive region 4. If the photons to be detected penetrate this photosensitive region, splitting of the electron-hole pair occurs, i.e. photo-induced charge carriers are produced.

The photosensitive region 4 is initially separated off from a further region, the transportation region 6, by the separation layer 5 which has doping of the same sign as the photosensitive region 4. The separation layer 5 is, however, not embodied in a continuous fashion but rather has a passage 7 which has doping of the same sign as the photosensitive region 4 and the transportation region 6. The charge carriers can pass from the photosensitive region into the transportation region 6 via this passage 7. The transportation region 6 has significantly stronger doping than the photosensitive region 4.

In the upper region of the transportation region 6 which faces the front side F, individual gates 8 are arranged along a transportation path of the transportation region 6. The overlapping region 9 of the passage 7 is located where the gates 8a and 8b are arranged. As a result of application of a potential or of a voltage to these gates 8a, 8b, charge carriers can pass from the photosensitive region 4 into the transportation region 6 through the passage 7. By using a clock generator 10, voltages are successively applied to the gate 8, started by the gates 8a, 8b as far as the right-hand edge of the transportation path in FIG. 1.

If electrons have been moved under a gate owing to a voltage having been applied to the gate, in the next clock pulse the gate located next to it also has a voltage of the same sign applied to it, with the result that charge carriers can also migrate to the gate. The original gate consequently changes its potential, with the result that the quantity of charge carriers can completely migrate under the adjacent gate etc. At the end of the transportation path 6 a reading device 11 for reading out the quantities of charge carriers is present. Subsequent to this, apart from the pixel or the part of the receiver device 1 illustrated in FIG. 1, it is possible to provide further components, for example, an A/D converter, in order to convert the analog signal which indicates the determined quantity of charge carriers into a digital signal. Subsequently, further evaluation electronics can be provided, for example, for implementing a formation of mean values or edge detection, and for thus determining the spatial focal point of the charge distribution over the path of the transportation region 6. For this purpose, the signals can be passed on to an evaluation apparatus A. It is conceivable to convert the signals from analog to digital by means of an A/D converter before the processing in the evaluation apparatus A.

By means of the clocking which is predefined by the clock generator 10, a corresponding integration time with which the detected light signal is sampled is also predefined. The charge carriers can be integrated under one of the gates 8 in these individual time intervals which are predefined by the clocking.

The invention has, in particular, the advantage that the influences of ambient light on the process for determining the desired distance can be kept as low as possible and it is also avoided that extreme values which are not caused by the output signal are incorrectly measured. In particular, the fluctuations in the light which are to be expected as a result of the ambient light are very low in frequency with respect to the emitted light pulses. The average propagation time of the emitted pulse is therefore not influenced by fluctuations in the ambient light either. The formation of mean values or else the edge detection average out these fluctuations.

Furthermore it is advantageously not significant whether a precise value of the absolute charge quantity can be determined. As a result, the costs for the actual photodetector structure can also be advantageously reduced. In this respect, it is also possible to use signals with relatively weak light and to decrease the intensity of such a sensor device.

Even if overexposure takes place (inadvertently) within certain limits, the charge carriers which are generated can be distributed over adjacent gates if these are "opened", that is to say have a potential which permits the charge carriers to be attracted into this region. Even in this case, it is possible to prevent, by means of averaging, the quality of the signal from being influenced or significantly influenced.

Figure 2:
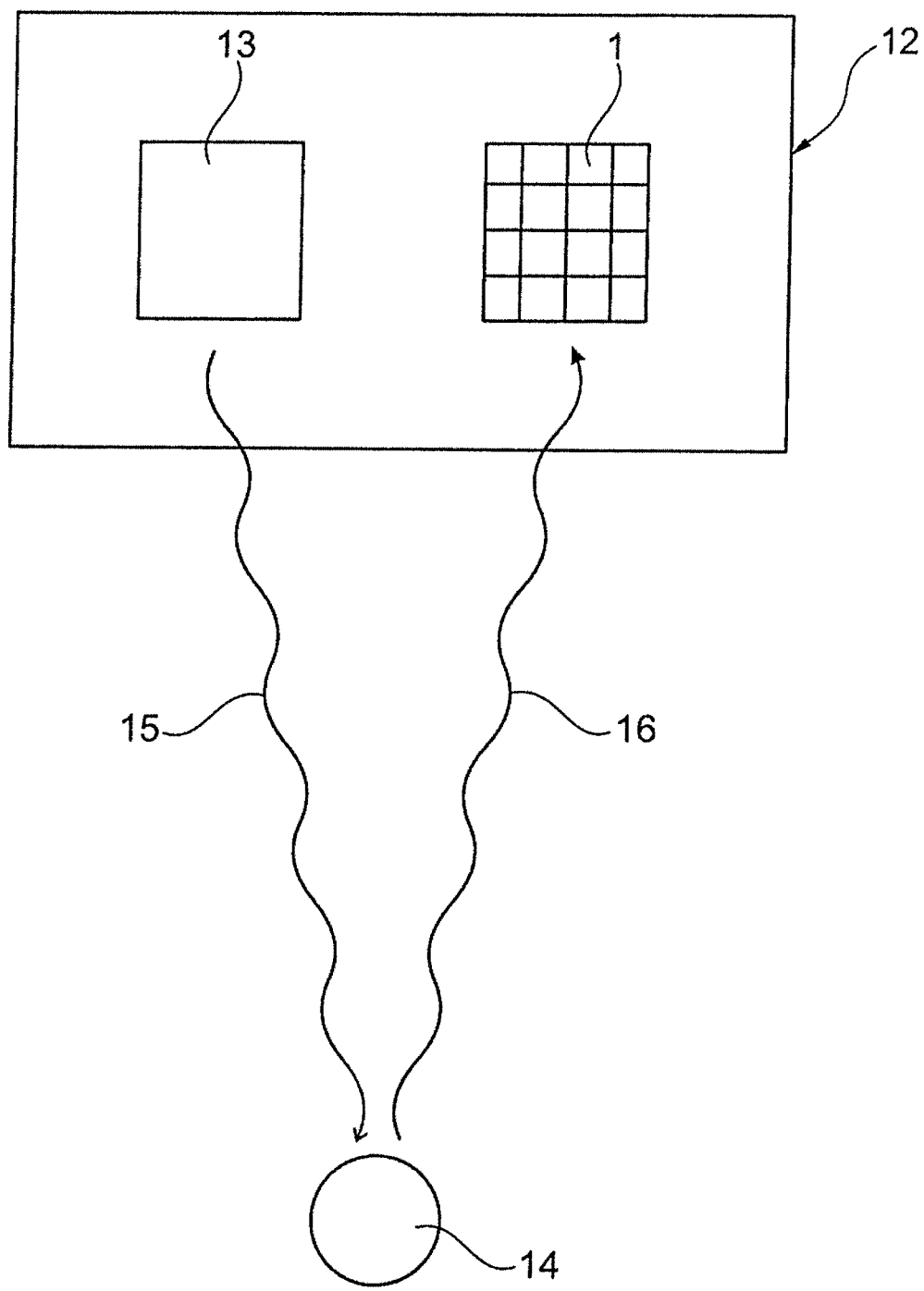
FIG. 2 shows a schematic illustration of a sensor device according to the present invention.

FIG. 2 shows a schematic illustration of a sensor device 12 according to the present invention with a transmitter 13 and a receiver 1, wherein the transmitter 13 emits a light signal 15 which is reflected at an object 14, wherein the reflected signal 16 is picked up by the receiver device 1. The receiver device 1 is embodied as a matrix.

LIST OF REFERENCE SYMBOLS:

1 Receiver device
2 Semiconductor structure
3 Semiconductor substrate
4 Photosensitive region
5 Separation layer
6 Transportation region
7 Passage
8 Gate
8a Gate in the overlapping region of the passage
8b Gate in the overlapping region of the passage
9 Overlapping region
10 Clock generator
11 Reading device
12 Sensor device
13 Transmitter
14 Object
15 Emitted signal
16 Reflected signal
A Evaluation apparatus
B Rear side
F Front side
S Detected light signals

The invention claimed is:

1. A receiver device for determining a distance from an object, comprising:
   a receiver for receiving signals reflected by the object and for generating photo-induced charge carriers,
   wherein the receiver comprises a semiconductor structure for detecting photons,
   wherein the semiconductor structure is designed to be back lit,
   wherein the semiconductor structure has a semiconductor substrate with a photosensitive region for generating photo-induced charge carriers, which region faces a rear side of the semiconductor substrate, and a transportation region for transporting the charge carriers, which transportation region faces a front side of the semiconductor substrate,
   wherein the photosensitive region and the transportation region are spatially separated from one another by a separation layer which has a passage between the photosensitive region and the transportation region, wherein the separation layer is a buried layer,
   wherein the transportation region has an arrangement of at least two gates lying one next to an other, at least one of the gates thereof being located in an overlapping region of the passage,
   wherein an evaluation apparatus is provided, the evaluation apparatus is configured to determine a maximum value in a chronological intensity profile of a light signal, which is a light pulse, and form a mean value or carry out detection of a changeover from rising pulse edge to falling pulse edge, and
   wherein a time measuring device is provided, the time measuring device is configured to determine a time period between emission of the light pulse and reception of a reflected light pulse.

2. The receiver device according to claim 1, wherein a voltage is applied to each of the gates in order to move the charge carriers under the respective gates in the transportation region.

3. The receiver device according to claim 1, wherein a clock generator is provided in order to alternately apply a voltage in succession to the gates, in order to move the charge carriers under the respective gates and therefore transport the charge carriers along the transportation region.

4. The receiver device according to claim 3, wherein the clock generator is designed to move the charge carriers from the photosensitive region at chronologically predefined intervals into the transportation region and to further transport the charge carriers along the transportation region, in order to convert a chronological resolution into a spatial resolution.

5. The receiver device according to claim 1, wherein the at least one gate which is arranged in the overlapping region of the passage is designed to move the charge carriers from the photosensitive region into the transportation region through the passage by virtue of the fact that a voltage is applied to a corresponding gate and/or gates.

6. The receiver device according to claim 1, wherein the transportation region is a conveyor belt structure of a CCD.

7. The receiver device according to claim 1, wherein the gates are metal contacts which are arranged on the front side of the semiconductor substrate.

8. The receiver device according to claim 1, wherein the photosensitive region and the passage have a first doping, the separation layer has a second doping, and the transportation region has a third doping, and
wherein the second doping is of an opposite sign to the first and/or third doping.

9. The receiver device according to claim 8, wherein the first doping is weakly doped in comparison to the second and/or third doping.

10. The receiver device according to claim 8, wherein the third doping is more strongly doped in comparison to the first doping.

11. The receiver device according to claim 1, wherein the transportation region comprises a reading device for determining quantities of the charge carriers.

12. The receiver device according to claim 1, wherein the receiver is a matrix.

13. A sensor device for determining a distance from an object, wherein a transmitter for emitting light pulses and the receiver device according to claim 1 are provided, in order to detect the signals thereof reflected at the object, wherein the sensor device is a TOF sensor device.

14. A method for determining a distance from an object, in which a light propagation time of a pulse is measured, the method steps comprising:
providing the receiver device according to claim 1;
emitting a light pulse having a maximum value in a chronological intensity profile;
receiving the signals reflected by the object in the photosensitive region of the semiconductor substrate of the semiconductor structure in order to generate the charge carriers;
providing the transportation region, separated from the photosensitive region by the separation layer, with the transportation path for transporting the charge carriers and with the passage between the photosensitive region and the transportation region, with the result that the charge carriers are transported through the passage, but not through the separation layer, which is the buried layer;
providing the at least two gates, lying one next to the other, in the region of the transportation path, the at least one of the gates thereof being located in the overlapping region of the passage, with the result that the charge carriers are attracted via the passage by applying a potential;
transporting the charge carriers at separate time intervals through the passage into the transportation region to map a chronological profile of the intensity of the light pulse spatially across the transportation path; and
performing clocked passing on of the charge carriers via the transportation path,
wherein a focal point of a spatial mapping of an intensity profile of the light pulse is determined by forming mean values and/or by edge detection.

* * * * *